United States Patent
Sasaki (10) Patent No.: US 7,098,682 B2
(45) Date of Patent: Aug. 29, 2006

(54) TESTING METHOD AND TESTER FOR SEMICONDUCTOR INTEGRATED CIRCUIT DEVICE COMPRISING HIGH-SPEED INPUT/OUTPUT ELEMENT

(75) Inventor: Mamoru Sasaki, Higashihiroshima (JP)

(73) Assignee: Japan Science and Technology Agency, Tokyo (JP)

( * ) Notice: Subject to any disclaimer, the term of this patent is extended or adjusted under 35 U.S.C. 154(b) by 0 days.

(21) Appl. No.: 10/497,514

(22) PCT Filed: Dec. 3, 2002

(86) PCT No.: PCT/JP02/12672

§ 371 (c)(1),
(2), (4) Date: Jun. 3, 2004

(87) PCT Pub. No.: WO03/048795

PCT Pub. Date: Jun. 12, 2003

(65) Prior Publication Data

US 2005/0077905 A1    Apr. 14, 2005

(30) Foreign Application Priority Data

Dec. 4, 2001    (JP) ............................. 2001-370609

(51) Int. Cl.
*G01R 31/02* (2006.01)
*G01R 31/26* (2006.01)
*G01R 31/28* (2006.01)

(52) U.S. Cl. ...................... 324/765; 324/763; 714/726; 714/733

(58) Field of Classification Search ........ 324/650–765; 714/726, 733
See application file for complete search history.

(56) References Cited

U.S. PATENT DOCUMENTS

| 6,754,867 | B1 * | 6/2004 | Ojha et al. ................... 714/739 |
| 6,777,971 | B1 * | 8/2004 | Kirloskar et al. ........... 324/765 |
| 6,859,902 | B1 * | 2/2005 | Dalal et al. ................. 714/726 |
| 2002/0145197 | A1 * | 10/2002 | Ohta et al. ................... 257/734 |
| 2002/0176236 | A1 * | 11/2002 | Iguchi et al. ............... 361/753 |
| 2003/0031133 | A1 * | 2/2003 | Momtaz ..................... 370/241 |
| 2003/0221152 | A1 * | 11/2003 | Volkerink et al. ........... 714/736 |
| 2004/0250187 | A1 * | 12/2004 | Schauer et al. ............. 714/728 |

FOREIGN PATENT DOCUMENTS

| EP | 0 780 767 | 6/1997 |
| JP | 06-201780 | 7/1994 |
| JP | 09-189749 | 7/1997 |

(Continued)

*Primary Examiner*—Vinh Nguyen
*Assistant Examiner*—Emily Y Chan
(74) *Attorney, Agent, or Firm*—Westerman, Hattori, Daniels & Adrian, LLP.

(57) ABSTRACT

The invention relates to a test method and a test apparatus for a semiconductor integrated circuit device having a high-speed input/output device, and it has for its object to perform the test of the high-speed I/O exceeding 1 GHz, promptly by a simple board construction, without altering a test system for individual I/O specifications. A semiconductor integrated circuit device (1) having a high-speed input/output device (2) is set on a load board (3) which is provided with loopback paths (4) each connecting the external output terminal and external input terminal of the semiconductor integrated circuit device (1) by transmission lines, and the operation of the high-speed input/output device (2) is tested within the semiconductor integrated circuit device (1) by utilizing test means (5) disposed inside the semiconductor integrated circuit device (1), and the loopback paths (4).

2 Claims, 8 Drawing Sheets

FOREIGN PATENT DOCUMENTS

| | | |
|---|---|---|
| JP | 10-170606 | 6/1998 |
| JP | 11-64442 | 3/1999 |
| JP | 2000-171524 | 6/2000 |
| JP | 2001-194417 | 7/2001 |

* cited by examiner

TESTING METHOD AND TESTER FOR SEMICONDUCTOR INTEGRATED CIRCUIT DEVICE COMPRISING HIGH-SPEED INPUT/OUTPUT ELEMENT

TECHNICAL FIELD

The present invention relates to a test method and a test apparatus for a semiconductor integrated circuit device having a high-speed input/output device, and more particularly to a test method and a test apparatus for a semiconductor integrated circuit device having a high-speed input/output device as feature simple constructions for efficiently performing the test of the semiconductor integrated circuit device (LSI) having the next-generation input/output interface which adopts a point-to-point interconnection scheme that connects two adjacent LSIs in one-to-one correspondence, and which operates at or above 1 GHz.

BACKGROUND ART

With the heightened speeds and enlarged capacities of optical communication networks in recent years, the operating frequency of a microprocessor has become 30 times higher, the operating speed of a hard disk drive 25 times higher, and the transfer rate of the network [Ethernet (registered trademark)] 100 times higher. On the other hand, it is the existing condition that the transfer rate of a PCI (Peripheral Component Interconnect) bus has hardly changed.

In processing the streaming dat a of a dynamic image, audio technology, etc., however, it has been desired to heighten the transfer rate still more.

In input/output interfaces of the next generation as conform to such a further heightened rate in the future, there are the tendency that multiple reflections are intended to be suppressed by adopting a point-to-point interconnection scheme which connects two adjacent LSIs in one-to-one correspondence, and the tendency that a narrow data-width on the order of 8 bits is adopted so as to facilitate the adjustment of a clock skew even at a high operating frequency.

The adoption of the point-to-point interconnections or the narrow data-width makes easy to employ a network structure which controls the transfer of data with a switch LSI centered, and it therefore affords a construction which is suitable for the transfer of the streaming data.

In this case, however, the interface must be operated at a much higher frequency than in a bus interface having a broad data-width.

By way of example, a high-speed input/output circuit which operates at or above 1 GHz is required in order that a data transfer rate being about 10 times higher than in a PCI bus of 32-bit width may be realized using a data bus of 8-bit width.

It is expected that, in order to comply with such a demand for the heightened rate, the quantity of production of LSIs each having a high-speed I/O of LVDS (Low Voltage Differential Signaling) or the like will steadily increase from now on.

Besides, the high-speed I/O includes a multiplexer, a PLL (Phase Locked Loop), or the like. Regarding a test, accordingly, there is necessitated a measure which is different from an LFT (Loose Function Test) or a DC test having hitherto been practiced for an I/O section, that is, an at-speed test.

Even at the present time, in specifications, a probe card itself or the very LSI tester is capable of coping with digital signals which exceed 1 Gbit/second.

However, the whole test system in which the card or the tester is combined is limited to a test for digital signals on the order of 200 Mbits/second to 400 Mbits/second. The circumstances will be explained with reference to FIG. 7.

Figure 7:
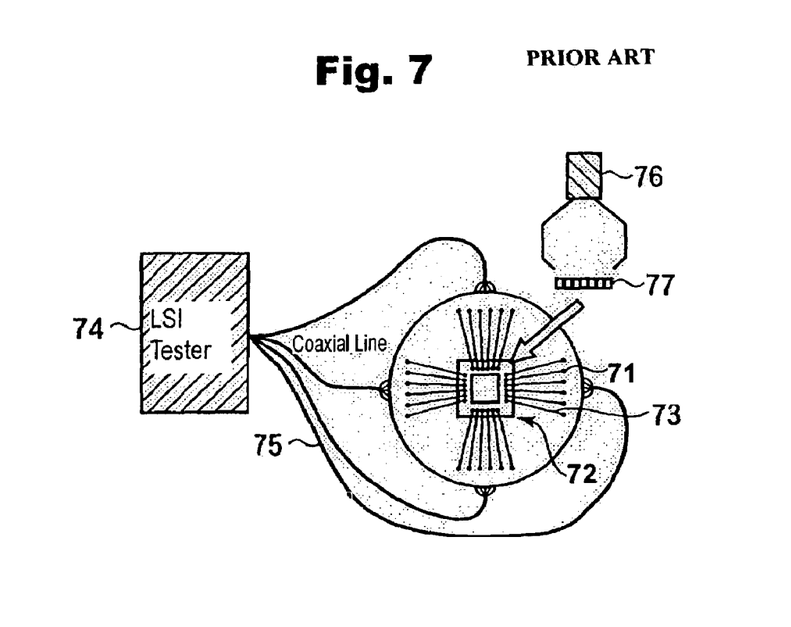
FIG. 7 is a conceptual constructional view of a prior-art test system.

Reference to FIG. 7:

FIG. 7 is the conceptual constructional view of a prior-art test system. In the prior-art test system, an IC socket 72 is disposed at the central part of a load board 71, lead lines 73 are laid so as to connect to the IC socket 72, and coaxial cables 75 are connected to an LSI tester 74 so as to couple to the lead lines 73.

Besides, using a handler 76, a DUT (Device Under Test) 77 which is a device to-be-tested is set on the IC socket 72 so as to perform a test.

In this case, the magnitudes of wiring lengths (cable lengths) from the DUT 77 to the LSI tester 74 being a waveform detection portion become a problem.

More specifically, in a high frequency signal whose clock frequency is 1 GHz or above, the distortion of a digital waveform appears under the influence of a skin effect which is proportional to the square of a line length, or a dielectric loss which is proportional to the line length. Therefore, in a case where the wiring length from the DUT 77 to the LSI tester 74 being the waveform detection portion is large, it becomes very difficult to detect a digital signal whose clock frequency exceeds 1 GHz.

In such a situation, there has been developed an analog BOST (Built-Out Self-Test) in which a measurement circuit and an analysis circuit for analog signals are mounted on the load board, whereby a general-purpose logic tester is permitted to perform an analog test.

Mentioned as the merits of the BOST are:

that, in the first place, a guarantee with an external interface included is possible;

that, secondly, the area penalty of a chip is not involved; and that, thirdly, observability in a chip evaluation is high.

When a BOST for an LSI having a high-speed I/O in the future is considered, the first and third merits stated above are conditions indispensable to the test of the high-speed I/O, and the test of the high-speed I/O is permitted by remarkably reducing the wiring length from the DUT to the signal detection portion as indicated before.

Meanwhile, in a semiconductor integrated circuit device (LSI), it has been proposed as a test facilitating design to separate the interior of the LSI into I/Os and internal logic by a boundary scan register. This will be described with reference to FIG. 8.

Figure 8:
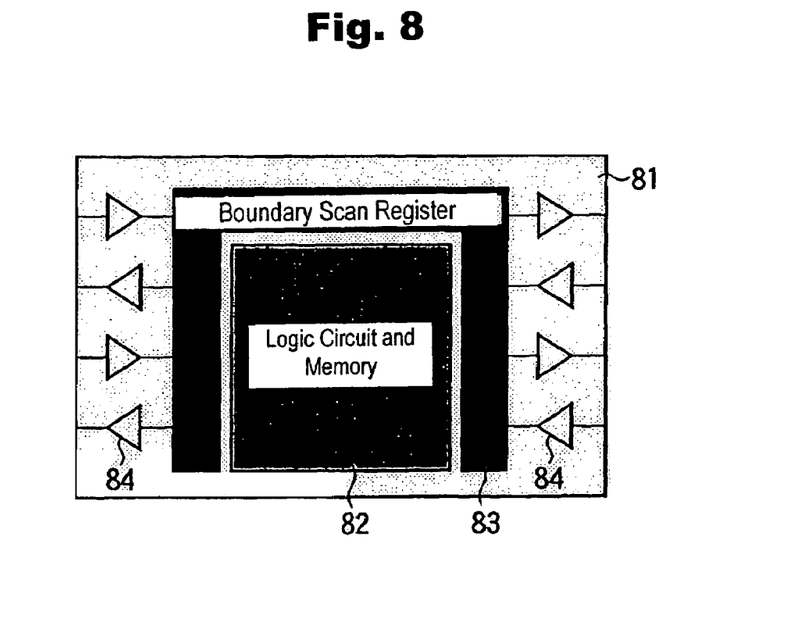
FIG. 8 is a conceptual constructional view of a semiconductor integrated circuit device which is provided with a boundary scan register.

Reference to FIG. 8:

FIG. 8 is the conceptual constructional view of a semiconductor integrated circuit device which is provided with a boundary scan register. The boundary scan register 83 is disposed at the outer peripheral part of a semiconductor chip 81, thereby to isolate I/Os 84 from internal logic 82 which is constituted by logic circuits, a memory, etc. disposed inside.

Owing to the use of such a boundary scan register, the test of the internal logic is facilitated, and it is simultaneously permitted to designate transmission signals or test reception signals for the high-speed I/Os.

Besides, a logic BIST (Built-In Self-Test) has been proposed as another test facilitating design. This will be described with reference to FIG. 9.

Figure 9:
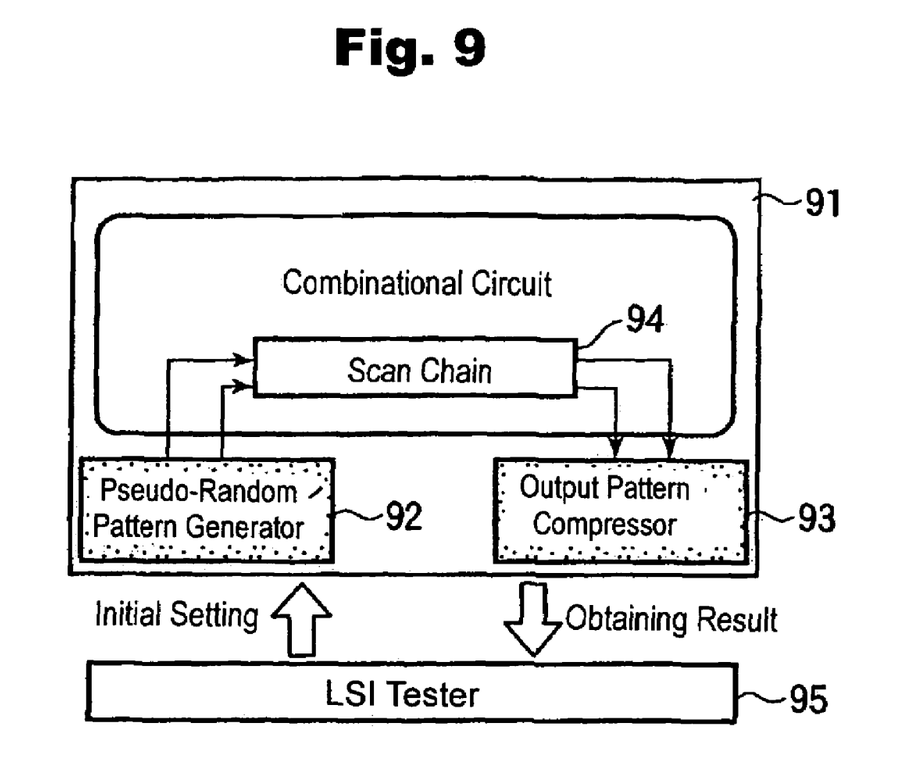
FIG. 9 is a conceptual constructional view of a semiconductor integrated circuit device which adopts a logic BIST.

Reference to FIG. 9:

FIG. 9 is the conceptual constructional view of a semiconductor integrated circuit device which adopts a logic BIST. A pseudo-random pattern generator 92 and an output pattern compressor 93 are disposed on a semiconductor chip 91, and the pseudo-random pattern generator 92 and the output pattern compressor 93 are connected by a scan chain 94.

An LSI tester 95 which is disposed outside in this case performs the initial setting of the pseudo-random pattern generator 92, and the obtainment of a result from the output pattern compressor 93.

Besides, unlike in the prior art, a test pattern is not outputted from the LSI tester 95, but it is outputted from the pseudo-random pattern generator 92 included in the LSI. The result of a test in the LSI is sent to the output pattern compressor 93.

Besides, the pseudo-random pattern generator 92 is constructed of, for example, an LFSR (Linear Feedback Shift Register), and the output pattern compressor 93 is constructed of, for example, an MISR (Multiple Input Signature Register), whereby the area penalty of the semiconductor chip 91 can be realized small.

In general, however, the BOST has the demerits:
that, in the first place, the number of pins of the chip is limited; and
that, secondly, a packaging space for packaging the measurement circuit and the analysis circuit is necessary on the load board. Among them, the first demerit poses no problem in the high-speed I/O test, but the second demerit concerning the packaging space needs to be solved.

Further, a problem peculiar to the high-speed I/O test in considering the BOST is adaptations to various specifications including input/output signal levels.

By way of example, in the high-speed I/O test, the BOST has the problem that the various specifications, such as the input/output signal levels [CML (Current Mode Logic), LVDS, etc.] and high-speed signal processing techniques [waveform emphasis (preemphasis), multi-valued transmission, simultaneous bidirectional transmission, etc.], must be conformed to.

On the other hand, the logic BIST has the problem that a test closed within the LSI cannot be performed for testing the I/O portion.

Accordingly, the present invention has for its object to perform the test of a high-speed I/O exceeding 1 GHz, promptly by a simple board construction, without altering a test system for individual I/O specifications.

DISCLOSURE OF THE INVENTION

Figure 1:
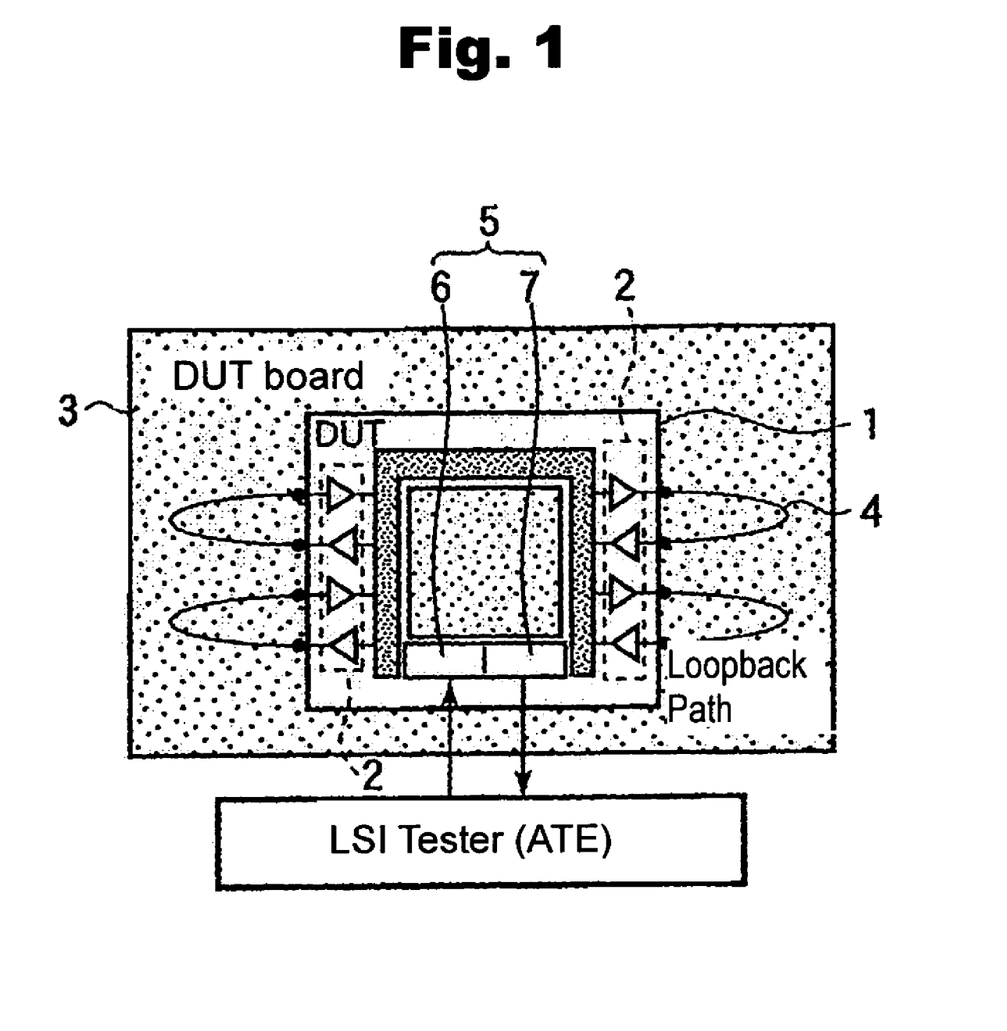
FIG. 1 is a view for elucidating the fundamental construction of the present invention.

FIG. 1 is the fundamental constructional view of the present invention. Here, means for solving the problems in the present invention will be described with reference to FIG. 1.

Reference to FIG. 1:

(1) The present invention consists in a test method for a semiconductor integrated circuit device 1 having a high-speed input/output device 2, characterized in that the semiconductor integrated circuit device 1 having the high-speed input/output device 2 is set on a load board 3 which is provided with loopback paths 4 each connecting an external output terminal and an external input terminal of the semiconductor integrated circuit device 1 by transmission lines, and that an operation of the high-speed input/output device 2 is tested within the semiconductor integrated circuit device 1 by utilizing test means 5 disposed inside the semiconductor integrated circuit device 1, and the loopback paths 4.

In this manner, the test of the characteristics of the high-speed input/output device 2, namely, a high-speed I/O is not performed by an LSI tester disposed outside, but it is performed by utilizing the test means 5 disposed inside the LSI, and the loopback paths 4 disposed in the load board 3, whereby the self-test closed within the LSI can be performed, and a line length can be shortened for the test, so that a digital waveform is not distorted, and a test measurement at a frequency exceeding 1 GHz becomes possible.

(2) Besides, the present invention consists in the above item (1), characterized in that the test means 5 disposed inside the semiconductor integrated circuit device 1 includes test pattern generation means 6, a boundary scan register which transfers test patterns generated by the test pattern generation means 6, to the high-speed input/output device 2, and check means 7 for accepting outputs by the external input terminals through the loopback paths 4.

In this manner, the test means 5 disposed inside the LSI is constructed of the test pattern generation means 6 for generating the transmission data patterns, the boundary scan register, and the check means 7, whereby the test of the characteristics of the high-speed I/O can be performed in a closed state.

(3) Besides, the present invention consists in the above item (1) or (2), characterized in that the test pattern generation means 6 is a pseudo-random pattern generator, and that the check means 7 is an output pattern compressor.

In this manner, the pseudo-random pattern generator constructed of an LFSR or the like is suitable as the test pattern generation means 6, while the output pattern compressor constructed of an MISR or the like is suitable as the check means 7, and the area penalty of an LSI chip can thus be made small.

(4) Besides, the present invention consists in a test apparatus for a semiconductor integrated circuit device 1 having a high-speed input/output device 2, characterized by comprising a load board 3 which is provided with loopback paths 4 each connecting by transmission lines an external output terminal and an internal output terminal of the semiconductor integrated circuit device 1 having the high-speed input/output device 2.

In this manner, the test apparatus is constructed of the load board 3 provided with the loopback paths 4, whereby a space for packaging a measurement circuit or an analysis circuit as is required in a BOST is dispensed with, so that the construction of the load board 3 can be simplified.

(5) Besides, the present invention consists in the above item (4), characterized in that the loopback paths 4 are constructed of, at least, multilayer wiring lines which are laid in the load board 3, and via holes which connect wire layers of different layer levels.

In this manner, the loopback paths 4 are constructed by utilizing the multilayer wiring lines laid in the load board 3, whereby the loopback paths 4 having any desired line lengths can be constructed within the load board 3 of small area, so that reduction in the size of the load board 3 becomes possible.

(6) Besides, the present invention consists in the above item (5), characterized in that each of the wire layers is constructed of transmission lines of coplanar structure.

In this manner, the transmission lines of coplanar structure are constructed as the transmission lines constituting the loopback paths 4, whereby a signal test pattern at a frequency of or above 1 GHz can be transmitted in a state of little waveform distortion and short delay.

(7) Besides, the present invention consists in the above item (5) or (6), characterized in that any bent part of each of the wire layers is formed by utilizing a polygonal pattern.

In this manner, the bent part of each of the wire layers, especially a bent part which is bent about 90° is formed by utilizing the polygonal pattern, whereby the discontinuity of a characteristic impedance can be relieved.

(8) Besides, the present invention consists in any of the above items (4) through (7), characterized in that loopback path lengths in respective pairs of output devices and input devices which constitute the high-speed input/output device 2 and which are coupled through the loopback paths 4 are equal to one another.

In this manner, the loopback path lengths in the respective pairs of the output devices and the input devices which are coupled through the loopback paths 4 are equalized to one another, whereby a high-accuracy test of uniform characteristics becomes possible.

BEST MODE FOR CARRYING OUT THE INVENTION

Here, a test system in an embodiment of the present invention will be described with reference to FIGS. 2 through 6.

Figure 2:
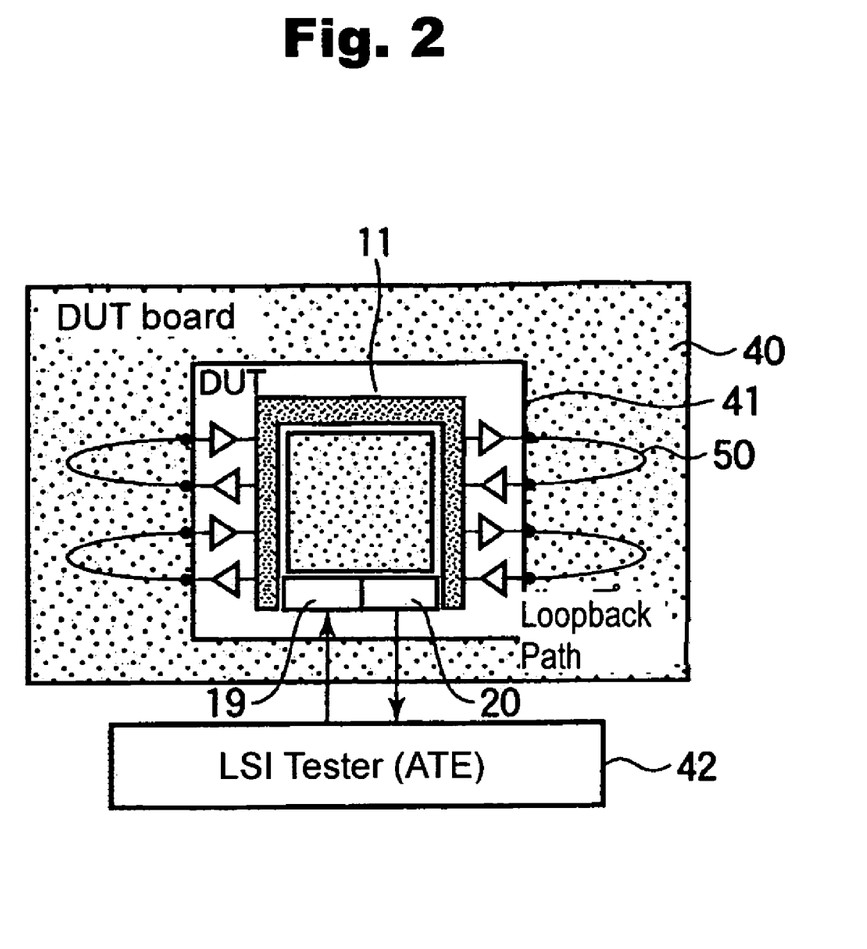
FIG. 2 is a conceptual constructional view of a test system in an embodiment of the present invention.

Reference to FIG. 2:

FIG. 2 is the conceptual constructional view of a test system in an embodiment of the present invention. A socket 41 which conforms to an FC-BGA (Flip Chip Ball Grid Array) of superior high-frequency characteristics is mounted on a load board 40 provided with loopback paths 50, and a test is performed by setting a DUT, namely, an LSI chip 11 to-be-measured on the socket 41.

Incidentally, an LSI tester 42 performs the initial setting of a pseudo-random pattern generator 19 and the obtainment of a result from an output pattern compressor 20.

Figure 3:
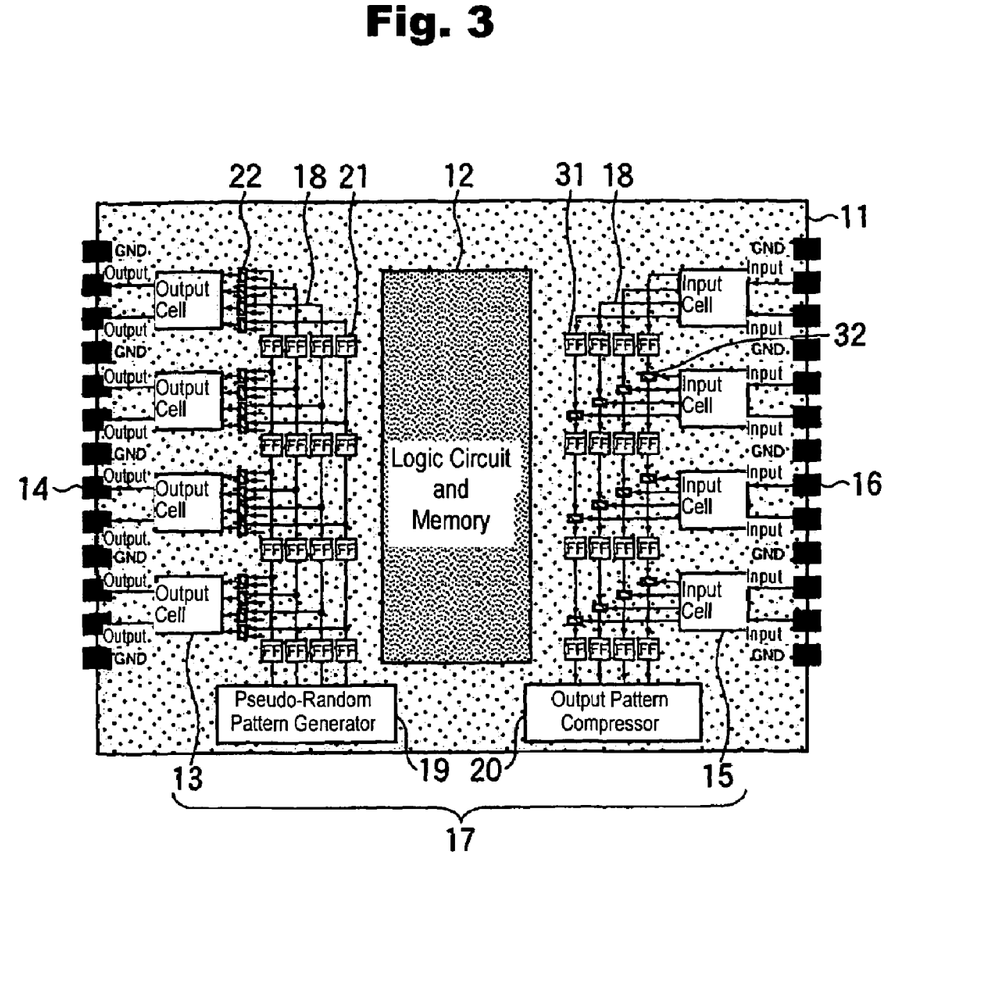
FIG. 3 is a conceptual constructional view of an LSI chip which has a high-speed I/O.
Figure 4:
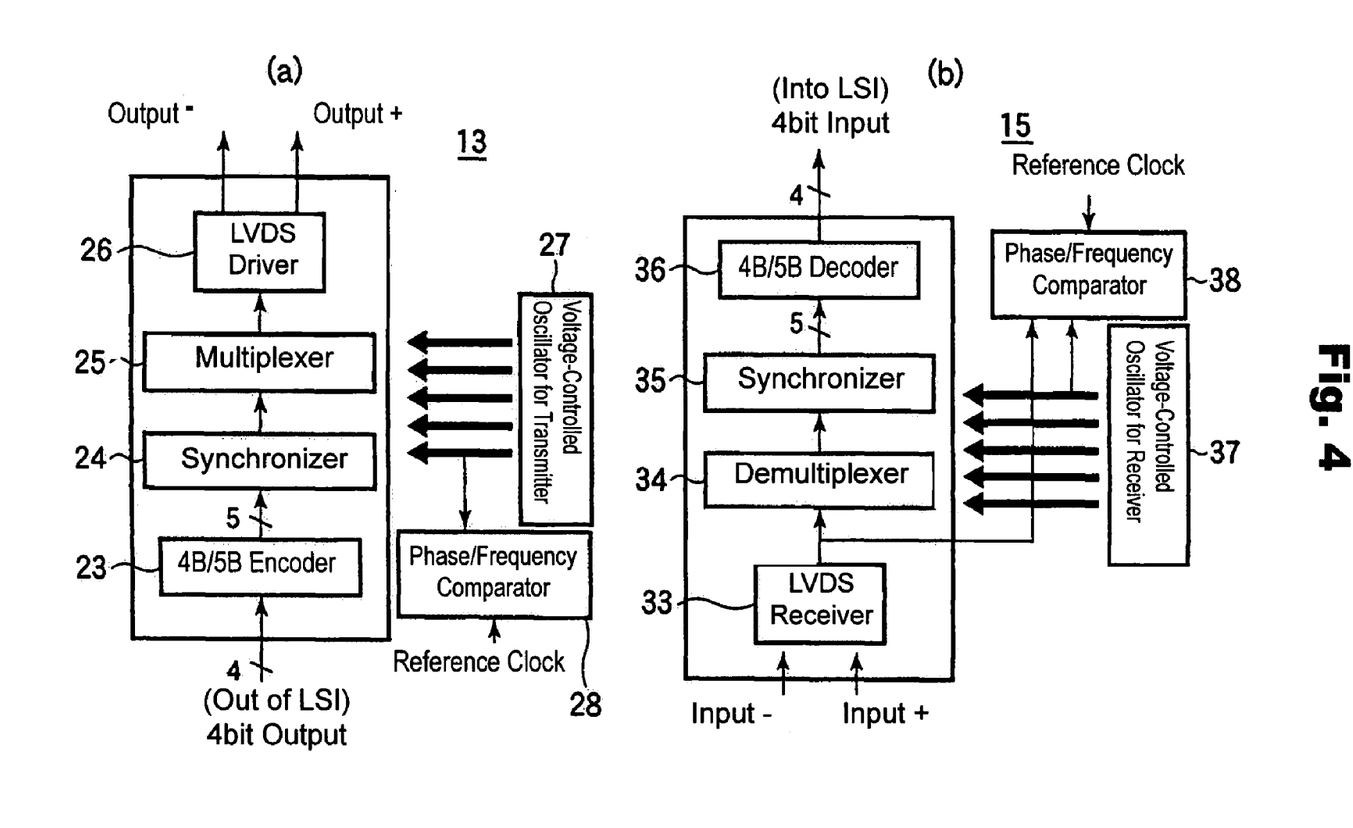
FIG. 4 is a conceptual constructional view of an output cell and an input cell which constitute the high-speed I/O.

Reference to FIG. 3:

FIG. 3 is the conceptual constructional view of an LSI chip 11 having a high-speed I/O which has been designed by a design scheme that facilitates the test of the interior of an LSI being a DUT. The LSI chip is configured of an internal logic 12 which is constituted by logic circuits, a memory, etc. disposed inside; output cells 13 which are connected to driver pins through pads 14, as well as input cells 15 which are connected to receiver pins through pads 16; a boundary scan register which is constituted by scan chains 18 that separate a high-speed I/O 17 consisting of the output cells 13 and the input cells 15, from the internal logic 12; a pseudo-random pattern generator 19 which is constructed of an LFSR that is connected to the output cells 13 through the scan chains 18; and an output pattern compressor 20 which is constructed of an MISR that is connected to the input cells 15 through the scan chains 18.

Incidentally, for the brevity of illustration, the output cells 13 and the input cells 15 are shown in a state where they are unilaterally integrated, respectively.

In this case, the scan chains 18 are prepared in the same number as the number of bits of parallel data which one I/O cell handles. In the figure, the four scan chains 18 are prepared assuming that one I/O cell transmit/receive the parallel data of 4 bits.

Besides, the output cells 13 are furnished with multiplexers 22 which switch data from the internal logic 12 and data from the scan chains 18 including flip-flops 21.

On the other hand, for the input cells 15, multiplexers 32 are prepared for changing-over data from the input cells 15 and data from directly preceding flip-flops 31.

Reference to FIG. 4(a):

FIG. 4(a) is the conceptual constructional view of the output cell 13 which constitutes the high-speed I/O. The output cell 13 is constructed of a 4B/5B encoder 23, a synchronizer 24, a multiplexer 25, an LVDS driver 26, a voltage-controlled oscillator for a transmitter, 27 which determines transmission timings with the driver, and a phase/frequency comparator 28.

In this example, the 4B/5B encoder 23 receives the 4-bit parallel data as an output delivered out of the LSI and adds 1 bit to the 4-bit data, thereby to encode the 4-bit data into 5-bit data. In this case, the bit which is added is inserted for the purpose of avoiding the succession of "0"s or "1"s so as to facilitate clock regeneration on a reception side.

Subsequently, the timings of an internal clock and a transmission clock are adjusted by the synchronizer 24. Thereafter, the multiplexer 25 and the LVDS driver 26 turn the 5-bit parallel data into serial data of 1 bit and output a differential signal of LVDS level (output + or output −).

In this case, a PLL which is constructed of the phase/frequency comparator 28 and the voltage-controlled oscillator for the transmitter, 27 forms the transmission clock whose frequency is 5 times higher than the frequency of the internal clock.

Reference to FIG. 4(b):

FIG. 4(b) is the conceptual constructional view of the input cell 13 which constitutes the high-speed I/O. The input cell 15 is constructed of an LVDS receiver 33, a demultiplexer 34, a synchronizer 35, a 5B/4B decoder 36, a voltage-controlled oscillator for a receiver, 37 which determines a reception timing, and a phase/frequency comparator 38.

Signals flow substantially reversely to those in the output cell 13. The serial data sent from transmission lines are received by the LVDS receiver 33. Subsequently, deserialization is performed by the demultiplexer 34, and the deserialized data are synchronized with the internal clock by the synchronizer 35.

Thereafter, the 1 bit added for the clock regeneration is removed by the 5B/4B decoder 36, whereby the deserialized data are decoded into the 4-bit parallel data.

In this case, a reception clock is regenerated from data which are sent by a PLL that is constructed of the phase/frequency comparator 38 and the voltage-controlled oscillator for the receiver, 37.

Figure 5:
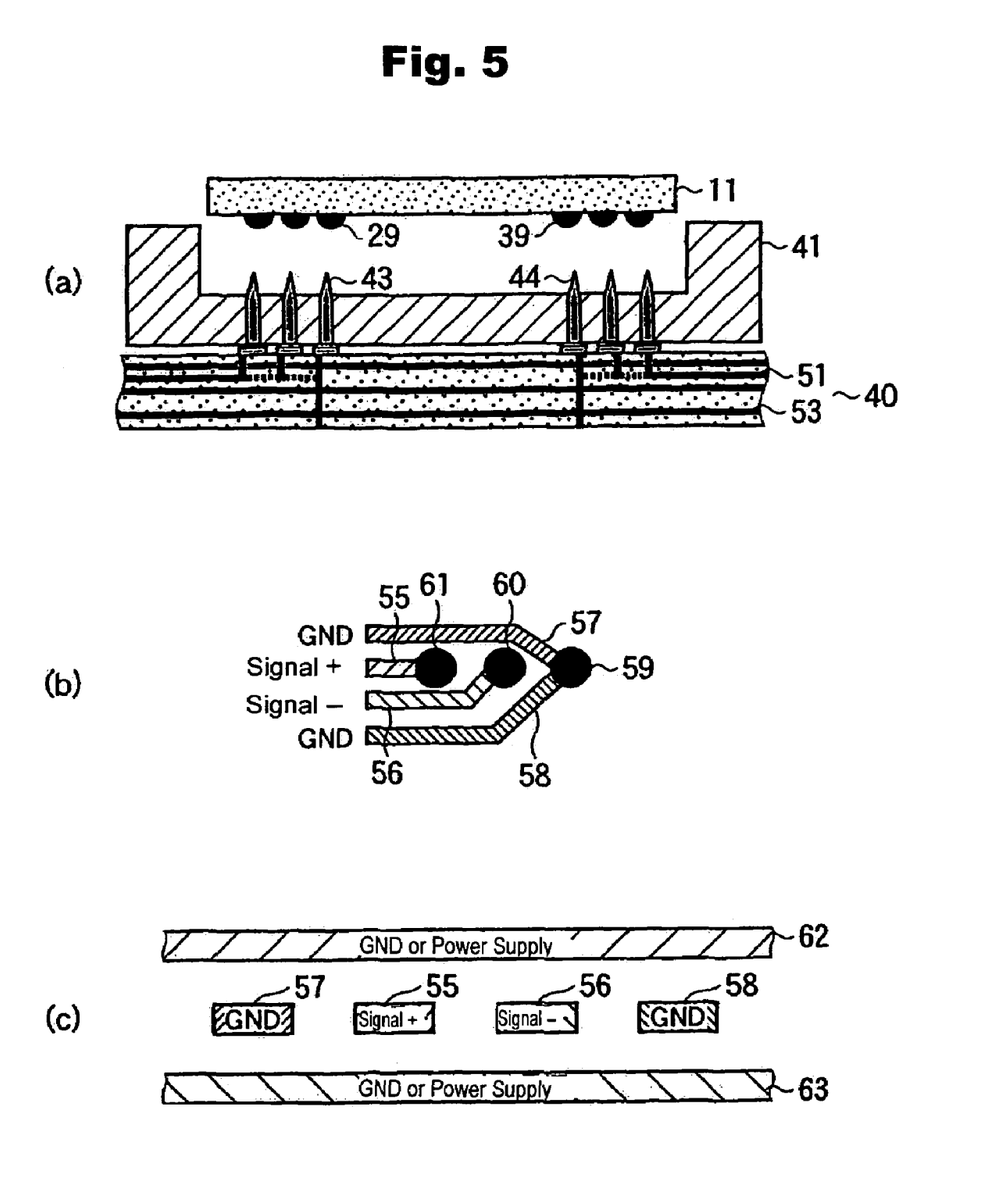
FIG. 5 is a view for explaining the construction of and around the socket of a load board.

Next, the construction of and around the socket of the load board will be described with reference to FIG. 5.

Reference to FIG. 5(a):

FIG. 5(a) is the schematic sectional view of the vicinity of the socket 41 of the load board 40. In this example, the driver pins 29 of the high-speed I/O are arranged on the left side of the FC-BGA disposed on the output terminal surface of the LSI chip 11, and the receiver pins 39 thereof are arranged on the right side.

Besides, in this example, the load board 40 is constructed of a multilayer-wired circuit board of 5-layer structure. A terminal 43 on the left side of the socket 41 is wired to the left end side of the figure by using the third wire layer 51 of the load board 40, it is thereafter changed-over to the fifth wire layer 53 and is wired to the right end side of the figure by a via hole 52, and it is changed-over to the third wire layer 51 again and is wired to a terminal 44 on the right side of the socket 41 by a via hole 54, thereby to form the loopback path 50.

Reference to FIG. 5(b):

FIG. 5(b) is the plan view of essential portions in the connection part of the third wire layer 51 with the terminal 43 of the socket 41. Two signal wiring lines 55, 56, and ground wiring lines 57, 58 surrounding them are laid so as to cope with the differential outputs (output+ and output −) of the LVDS driver 26 constituting the output cell 13, thereby to construct those transmission lines of coplanar structure in which the differential signals are put side by side even in the wire layer of the same layer level, and in which both the sides of them are held between the ground wiring lines.

Incidentally, numerals 59, 60 and 61 designate the connection portions of via holes.

Parameters, such as a wiring line width and a wiring line interval, are determined so that the characteristic impedances of the transmission lines may match with the input/output impedance of the high-speed I/O.

Reference to FIG. 5(c):

FIG. 5(c) is the sectional view of the essential portions of the load board 40. Wire layers 62 and 63 which overlie and underlie the wire layer where the signal wiring lines 55, 56 are laid, in this case, the third wire layer 51, respectively, are made allover wiring lines for power supply or ground, and the signal wiring lines 55, 56 are held between the wire layers 62 and 63, whereby a microstrip line is constructed.

Besides, as stated above, the signal wiring lines 55, 56 have the coplanar structure in which both their sides are held between the ground wiring lines 57, 58.

Figure 6:
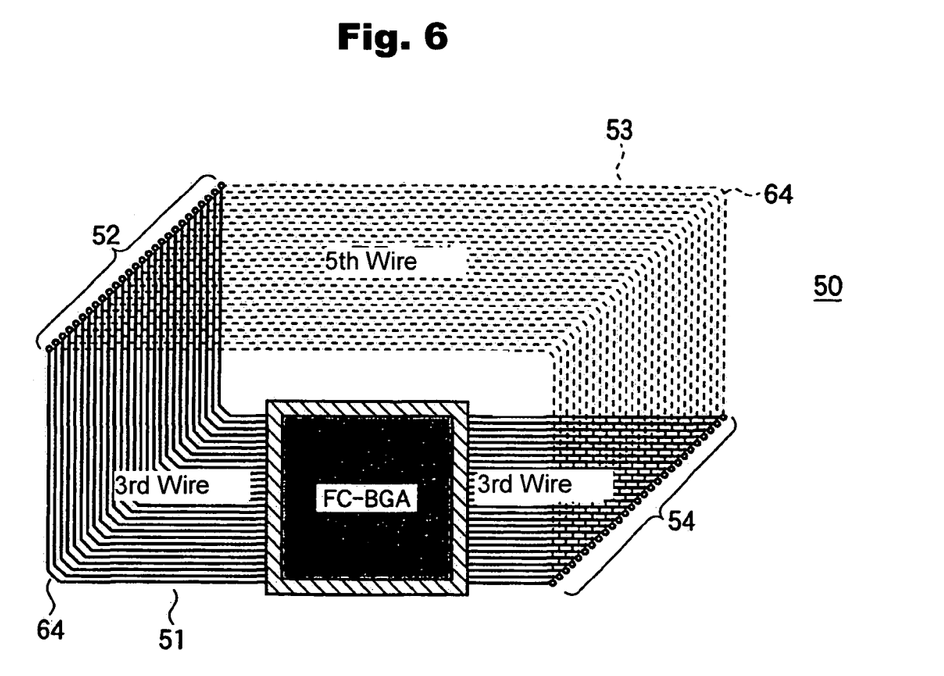
FIG. 6 is a conceptual constructional view of a loopback path.

Reference to FIG. 6:

FIG. 6 is a view conceptually showing the construction of such a loopback path 50. The equal-length wiring of all the loopback paths 50 is realized by wiring illustrated in the figure.

By the way, the line length of each loopback path 50 in this case is made about 300 mm.

Besides, in a case where the wiring line of the third wire layer 51, the fifth wire layer 53 or the like is bent 90 degrees, a bent part 64 based on a polygonal pattern is formed, thereby to relieve the discontinuity of the characteristic impedance.

The self-test of the high-speed I/O is performed by employing the test system described above. Regarding the high-speed I/O, a test based on successive bit strings is often required for testing the clock regeneration or the like. In such a case, the test is carried out every pair consisting of the output cell and the input cell.

In this test, first of all, pattern strings which are generated by the pseudo-random pattern generator 19 disposed within the LSI chip 11 are sequentially sent to the specified output cell to-be-tested by the scan register which is joined to the output cell 13. For this purpose, the multiplexer 22 which is prepared for the specified output cell to-be-tested is switched so that data on the side of the scan register may pass therethrough.

Thus, the specified output cell sequentially transmits the pattern strings sent from the scan register, to the transmission lines which constitute the loopback path 50 on the load board 40.

On the other hand, the sent transmission data are received in the specified input cell 15 which is connected with the specified output cell currently under test, by the transmission lines constituting the loopback path 50 on the load board 40, and the received data are sequentially sent to the output pattern compressor 20 by the scan register which is joined to the input cell.

On this occasion, the multiplexer 32 prepared for the input cell 15 is switched onto the side of the flip-flops 31 in order that only the specified input cell currently under test may be connected to the scan register, and that the reception data of the other input cells may be sequentially sent to the output pattern compressor 20.

After the series of pattern strings have been transmitted and received in this way, data compressed by the output pattern compressor 20 are read by the LSI tester 42 disposed outside, so as to decide if the pattern strings have been normally transferred in the input/output cell pair to-be-tested.

Thereafter, the above test cycle is iterated the number of input/output cell pairs.

Owing to the adoption of such a test system of the present invention, there are brought forth the advantages:

1. that the self-test of an LSI having a high-speed I/O above 1 GHz, which has been difficult with existing LSI testers, becomes possible;
2. that, since a measurement circuit or an analysis circuit is not required on a load board, a packaging space on the load board as is the demerit of a BOST is relieved; and
3. that, since the self-test uses the I/O itself of the LSI, the test system need not be redesigned in accordance with individual I/O specifications.

Although the embodiment of the present invention has been described above, the invention is not restricted to the constructions and conditions stated in the embodiment, but various alterations are possible.

By way of example, in the foregoing embodiment, the transmission lines constituting the loopback paths within the load board are constructed of the coplanar structure, but they may well be constructed of a coaxial structure by employing a buried plating technique.

Besides, in the foregoing embodiment, the loopback paths are endowed with the single line length, but they may well be set at desired line lengths in such a way that transmission paths are switched by disposing a switching circuit.

Besides, although test pattern generation means is constructed of the pseudo-random pattern generator in the foregoing embodiment, it is not restricted to a pseudo-random pattern generator in a narrow sense, but it may be any pattern generator which can generate test patterns capable of testing the characteristics of the high-speed I/O.

Besides, although check means is constructed of the output pattern compressor in the foregoing embodiment, it is not restricted to an output pattern compressor in a narrow sense, but it may be any means capable of performing checks in accordance with the aspect of the test patterns.

INDUSTRIAL APPLICABILITY

As described above, a test method and a test apparatus according to the present invention for a semiconductor integrated circuit device having a high-speed input/output device are suited for the test of the I/O of the semiconductor integrated circuit device having test means BIST, and they are especially suited for the test of a high-speed I/O exceeding 1 GHz.

The invention claimed is:

1. A method for testing a semiconductor integrated circuit device having a high-speed input/output device, comprising the steps of:

setting the semiconductor integrated circuit device on a load board including a plurality of loopback paths each connecting an external output terminal and an external input terminal of the semiconductor integrated circuit device by transmission lines;

testing an operation of the high-speed input/output device of the semiconductor integrated circuit device by utilizing a test means disposed inside the semiconductor integrated circuit device, and the loopback paths, wherein the test means including:

a test pattern generation means;

a boundary scan register which transfers test patterns generated by the test pattern generation means, to the high-speed input/output device; and a check means which accepts and checks outputs delivered through the loopback paths, through the external input terminals.

2. The method for testing the semiconductor integrated circuit device having a high-speed input/output device as defined in claim 1, wherein the test pattern generation means is a pseudo-random pattern generator, and that the check means is an output pattern compressor.

* * * * *